United States Patent [19]

Auray

[11] 3,746,239

[45] July 17, 1973

[54] DESOLDERING DEVICE

[76] Inventor: Didier Henri Clement Auray, 4 rue Des Tartres, Rueil 92, France

[22] Filed: Nov. 12, 1970

[21] Appl. No.: 88,873

[52] U.S. Cl. ..................... 228/19, 29/426, 219/230, 228/51

[51] Int. Cl. ............................................ B23k 1/00

[58] Field of Search .................. 228/19, 20, 21, 52, 228/51; 219/85, 230, 229; 15/344; 29/426

[56] References Cited

UNITED STATES PATENTS

| | | | |
|---|---|---|---|
| 2,602,180 | 7/1952 | Miller | 228/20 |
| 3,045,095 | 7/1962 | Usher et al. | 228/20 X |
| 3,084,649 | 4/1963 | Parstarfer | 228/19 |
| 3,130,286 | 4/1964 | Lenzi | 228/20 |
| 3,239,124 | 3/1966 | Hathcock | 228/20 |
| 3,443,733 | 5/1969 | Parente | 228/20 |
| 3,649,809 | 3/1972 | Halstead | 219/228 |

*Primary Examiner*—J. Spencer Overholser
*Assistant Examiner*—Robert J. Craig
*Attorney*—Lane, Aitken, Dunner & Ziems

[57] ABSTRACT

A device for desoldering one or more soldered connections wherein a heat conductive head member is provided with several projections for simultaneously contacting and melting each soldered connection. The soldered connections are isolated from each other during the melting operation to prevent any flow of melted solder, and means are carried by the heat conductive member for discharging the melted solder from the connections. A method of desoldering one or more soldered connections.

4 Claims, 6 Drawing Figures

INVENTOR

DIDIER AURAY

BY Lane, Aitken, Dunner & Ziems
ATTORNEYS

DESOLDERING DEVICE

BACKGROUND OF THE INVENTION

This invention relates to a desoldering device and method and, more particularly, to a device and method for desoldering the leads of electronic components from a printed circuit board, or the like.

The use of printed circuit boards of synthetic materials, or the like, which are adapted to receive various electronic and/or integrated circuit components is becoming more and more widespread. In these arrangements the components are placed on one face of the board and the conductive leads of the components are inserted through holes extending through the board. The leads are then soldered to the opposite face of the board usually by the conventional wave soldering technique, with the board shielding the components from the heat required to maintain the solder in a liquid state.

After a component has been mounted in the above manner, it is difficult to remove it from the board for replacement or testing purposes. The difficulties are compounded due to the fact that the component and the printed circuit portion of the board are usually sensitive to heat, and often must be retained in their original state for further use or to determine the cause of any defect.

The most common method of removal is to use a soldering iron to melt each individual soldered connection. Of course, this is tedious, time consuming and not practical in high-speed production applications. Other techniques employ the use of irons having relatively large tips in order to melt several connections at one time. However, this technique often results in a flow of the melted liquid solder between the connections causing bridges between the various printed conductors and resulting short-circuits.

As a further disadvantage of both of the above-mentioned desoldering techniques, it has been discovered that when the component is withdrawn from the printed circuit board after the desoldering operation, the holes in the board through which the leads of the component had previously extended often become obstructed or plugged by a supply of solder which later hardens. This requires a tedious unplugging of the holes, which is normally achieved by melting each individual supply of solder with a soldering iron, and then sucking the solder into a suction device, usually in the form of a bulb of elastic material. This technique is often ineffective, largely due to the fact that the highly dense liquid solder often collects in the lower part of the bulb and subsequently flows back into the circuit, producing bridges and resultant short-circuits between the various components. Also, if care is not taken to clear the elastic bulb of the melted solder that does collect therein, the bulb becomes quickly clogged after the solder cools.

Attempts have been made to avoid the latter disadvantage by utilizing desoldering irons having an operational temperature much greater than the melting point of the solder. However, this technique may result in heat damage to the printed circuit, the electronic components and the printed circuit board.

SUMMARY OF THE INVENTION

It is therefore an object of the present invention to provide a desoldering device and method where several soldered connections can be simultaneously desoldered without the risk of bridging, or short-circuiting, the various connections.

It is a further object of the present invention to provide a desoldering device and method where the melted solder can be removed from the holes in the circuit board after the electronic component has been removed from the board, without danger of damaging the board, the printed circuit on the board or the component.

Toward the fulfillment of these objects, the device of the present invention comprises a heat conductive member for simultaneously melting one or more soldered connections and means carried by said heat conductive member for discharging the melted solder from the vicinity of the heat conductive member and the connection. The method of the present invention comprises the steps of applying heat energy to the soldered connections to melt the solder, preventing the flow of melted solder and discharging the melted solder away from the vicinity of the connections.

BRIEF DESCRIPTION OF THE DRAWINGS

Reference is now made to the accompanying drawings for a better understanding of the nature and objects of the present invention. The drawings illustrate the best mode presently contemplated for carrying out the objects of the invention and are not to be construed as restrictions or limitations on its scope. In the drawings.

DESCRIPTION OF THE PREFERRED EMBODIMENTS

Figure 1:
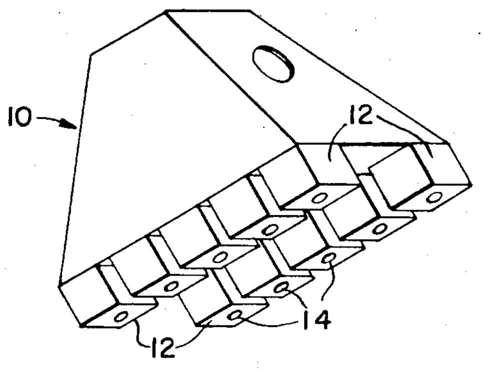
FIG. 1 is a perspective view of a head member utilized in the device of the present invention.
Figure 2:
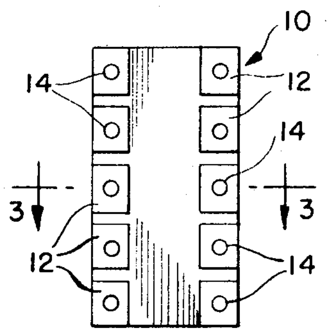
FIG. 2 is a bottom plan view of the head member of FIG. 1.

Referring specifically to FIGS. 1 and 2 of the drawings, the reference numeral 10 refers to a head member of a heat conductive material that is utilized in the desoldering device of the present invention. The head member is in the form of a polyhedron and has a plurality of generally cube shaped projections 12 extending from one plane surface thereof. The projections may be machined integral with the head member 10 and are shown aligned in two spaced, parallel rows for the purposes of example, it being understood that this pattern is identical to a pattern of soldered connections between one or more electronic components and the printed circuit on a particular printed circuit board (not shown).

A cavity 14 is formed in the free end of each of the projections 12 and each cavity is of a height and depth to receive a corresponding soldered connection. In this manner, when the head member 10 is placed over the soldered connections the latter extend into their respective cavities 14 in a heat exchange relationship with the head member.

Figure 3:
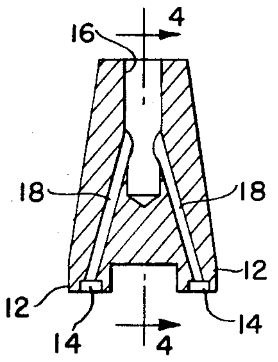
FIGS. 3 and 4 are cross-sectional views taken along the lines 3—3 and 4—4 of FIGS. 2 and 3, respectively.
Figure 4:
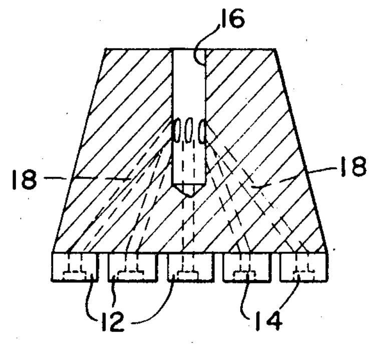

As shown in FIGS. 3 and 4, a central bore 16 is formed through a portion of the head member 10 and connects with a plurality of branch bores 18 which, in turn, register with the respective cavities 14 formed in the projections 12.

Figure 5:
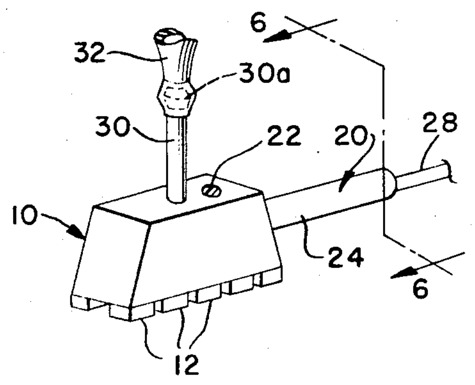
FIG. 5 is a perspective view of the assembled device of the present invention.
Figure 6:
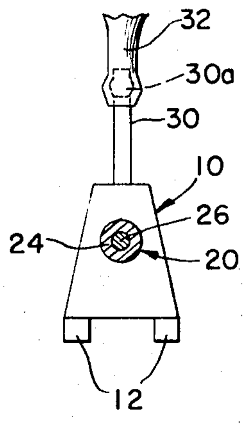
FIG. 6 is a cross-sectional view taken along the lines 6—6 of FIG. 5.

The complete assembled device is shown in FIGS. 5 and 6, and includes a handle 20 extending into a bore formed through the head member 10. A set screw 22 is threadably mounted within a tapped bore formed in the head member 10 and engages the handle 20 to releasably secure the handle relative to the head member. As shown in FIG. 6, the handle 20 consists of a cylindrical insulating portion 24 extending over a metal rod 26. The rod 26 extends for the length of the handle 20 into the interior of the head member 10 and is adapted to be heated by conduction by electrical current from appropriate conductors (not shown) connected to the rod.

A rigid tube 30 has one end portion extending within and secured relative to the central bore 16 of the head member 10. The tube 30 has an enlarged end portion 30a which is adapted to receive an elastic tube 32 extending from a pressurized air source (not shown) which, when actuated, forces air through the tube 30 and into the bore 16.

In operation, the operator grasps the handle 20 and places the head member 10 against the face of the particular circuit board opposite the face on which the electronic components are mounted, so that the projections 12 are aligned with the corresponding soldered connections in a heat exchange relationship therewith, with the cavities 14 extending over the connections. Heat from the metal rod 24 is conducted to the head member 10 and to the projections 12 to melt the soldered connections. The cavities 14 function to isolate the soldered connections from each other and thus prevent any flow of melted solder. The component leads that are thus freed can be easily removed from their respective holes and from the circuit board. The source of compressed air is then actuated to force air through the tube 30, the central bore 16, the branch bores 18, the cavities 14 and against the melted solder which remains in the holes in the board. This discharges the solder out and away from the holes and the board and clears the holes for future use.

It is thus seen that the device of the present invention provides a simple and efficient method of simultaneously melting the various soldered connections without causing any short-circuits or damage to the components mounted on the board, while providing an equally simple and easy removal of the melted solder.

It can be appreciated that the head unit 10 is easily interchangeable with another head unit having a different configuration of projections 12 in order to accomodate various patterns of soldered connections on one or more boards.

Several modifications can be made in the foregoing without departing from the scope of the invention. For example, the soldered connections do not necessarily have to be made on a printed circuit board, but can be in any other conventional environment. Also, a fluid source other than air can be used to discharge the melted solder from the holes. Other variations in the specific construction and arrangement of the desoldering device and method disclosed above can be made by those skilled in the art without departing from the invention as defined in the appended claims.

I claim:

1. A device for desoldering a plurality of soldered connections on a support member, said device comprising a heat conductive member having a plurality of projections extending therefrom and extending in a pattern corresponding to the pattern of said soldered connections for simultaneously melting said connections each of said projections being spaced from its adjacent projection and having a a cavity means formed therein for receiving said connections, to concentrate heat in one of said pattern and to prevent the flow of melted solder along said support member, and means for applying heat to said heat conductive member.

2. The device of claim 1 further comprising means for discharging said melted solder from the vicinity of said projections and said support member.

3. The device of claim 2 wherein said means for discharging said solder comprises means to direct pressurized fluid through said projections and to the melted solder in said cavities to blow the melted solder from the vicinity of said projections and said support member.

4. The device of claim 1 further comprising a handle releasably secured to said heat conductive member, said handle including means for causing said heating means to be heated.

* * * * *

-1050
/69)

UNITED STATES PATENT OFFICE
CERTIFICATE OF CORRECTION atent No. 3,746,239 Dated July 17, 1973 nventor(s) DIDIER HENRI CLEMENT AURAY

It is certified that error appears in the above-identified patent nd that said Letters Patent are hereby corrected as shown below:

Column 4, line 27, "having a a cavity" should read -- having a cavity--.
Column 4, line 28, "receiving said connections," should read --receiving one of said connections,--
Column 4, line 29, "in one of said pattern" should read --in said pattern--.

Signed and sealed this 26th day of March 1974.

(SEAL)
Attest:

EDWARD M. FLETCHER, JR.
Attesting Officer

C. MARSHALL DANN
Commissioner of Patents